(12) United States Patent
Sugimoto

(10) Patent No.: US 9,992,868 B2
(45) Date of Patent: Jun. 5, 2018

(54) WIRED CIRCUIT BOARD HAVING ONE OF THE CONDUCTIVE LAYERS DISPOSED IN AN OPENING FORMED IN METAL SUPPORTING BOARD

(71) Applicant: NITTO DENKO CORPORATION, Osaka (JP)

(72) Inventor: Yuu Sugimoto, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days. days.

(21) Appl. No.: 15/305,188

(22) PCT Filed: Mar. 20, 2015

(86) PCT No.: PCT/JP2015/058472
§ 371 (c)(1),
(2) Date: Oct. 19, 2016

(87) PCT Pub. No.: WO2015/163058
PCT Pub. Date: Oct. 29, 2015

(65) Prior Publication Data
US 2017/0042024 A1     Feb. 9, 2017

(30) Foreign Application Priority Data
Apr. 21, 2014   (JP) ................. 2014-087046

(51) Int. Cl.
*H05K 1/03*     (2006.01)
*H05K 1/05*     (2006.01)
(Continued)

(52) U.S. Cl.
CPC ............... *H05K 1/05* (2013.01); *G11B 5/484* (2013.01); *G11B 5/4853* (2013.01); *H05K 1/056* (2013.01); *H05K 1/113* (2013.01); *G11B 5/4873* (2013.01)

(58) Field of Classification Search
CPC .......... H05K 1/05; H05K 1/056; H05K 1/113; G11B 5/484; G11B 5/4853; G11B 5/4873
(Continued)

(56) References Cited

FOREIGN PATENT DOCUMENTS

| JP | 2011-082302 A | 4/2011 |
|---|---|---|
| JP | 5195956 B2 | 2/2013 |

OTHER PUBLICATIONS

International Search Report Issued in PCT/JP2015/058472 dated May 12, 2015.
(Continued)

*Primary Examiner* — Tremesha S Willis
(74) *Attorney, Agent, or Firm* — Edwards Neils LLC; Jean C. Edwards, Esq.

(57) ABSTRACT

A wired circuit board includes a metal pedestal portion formed from a metal material that is the same as the material of the metal supporting board at the pad portion, a pedestal opening formed by opening the metal pedestal portion, a lower conductive layer disposed on one side in the thickness direction of the metal pedestal portion as the first conductive layer, and an upper conductive layer as the second conductive layer formed on one side in the thickness direction of the lower conductive layer as the first conductive layer, wherein one of the lower conductive layer as the first conductive layer and the upper conductive layer as the second conductive layer is disposed in the pedestal opening when projected in the thickness direction, and the periphery of the other is disposed outside of the pedestal opening when projected in the thickness direction.

6 Claims, 11 Drawing Sheets

(51) Int. Cl.
*G11B 5/48* (2006.01)
*H05K 1/11* (2006.01)

(58) Field of Classification Search
USPC ............... 174/255, 250, 256–258, 261, 267
See application file for complete search history.

(56) References Cited

OTHER PUBLICATIONS

Written Opinion Issued in PCT/JP2015/058472 dated May 12, 2015.
International Preliminary Report on Patentability issued by WIPO dated Nov. 3, 2016, in connection with International Patent Application No. PCT/JP2015/058472.
Notification of Reasons for Refusal issued by the Japanese Patent Office on Jan. 9, 2018, in connection with Japanese patent Application No. 2014-087046.

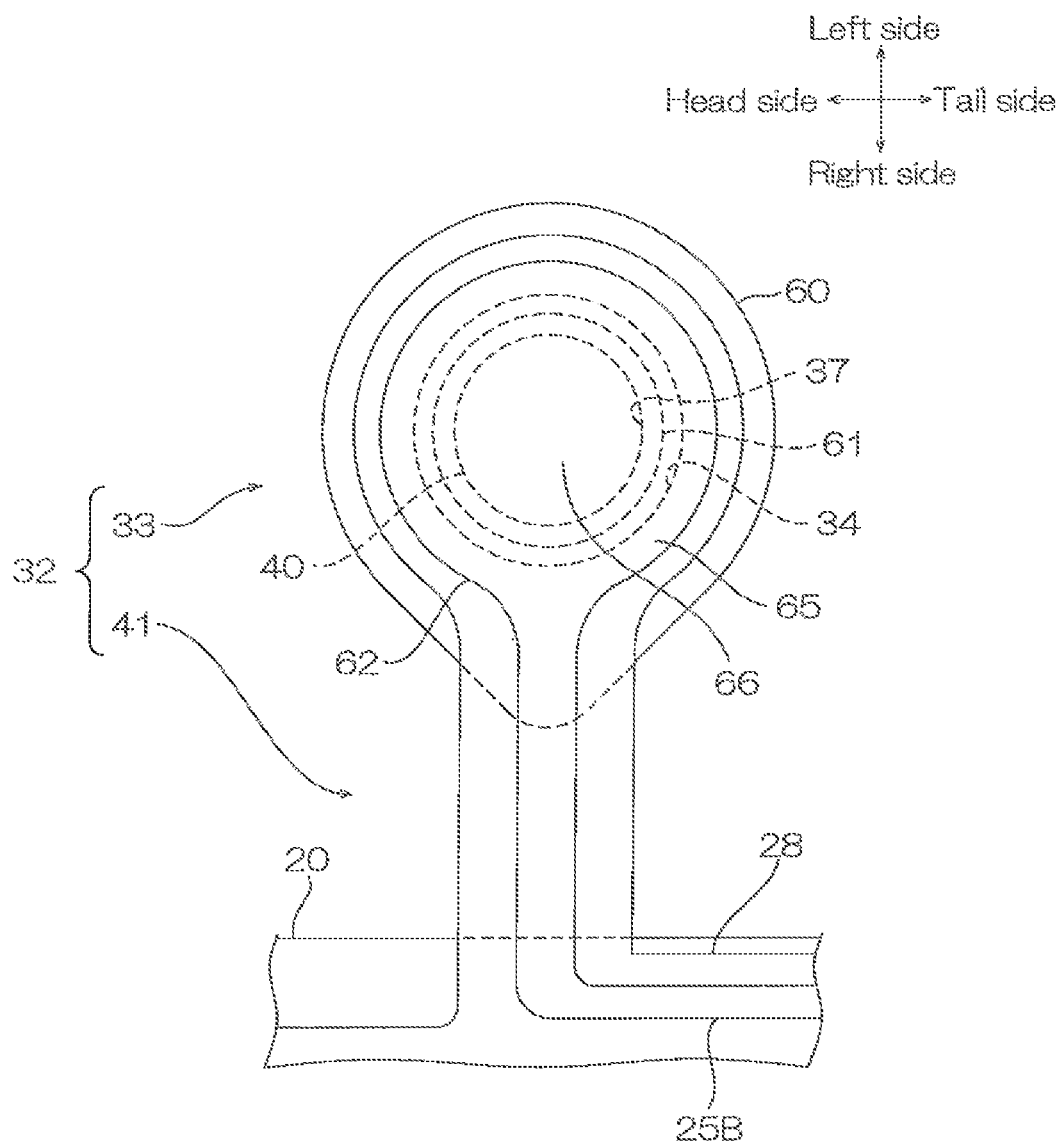

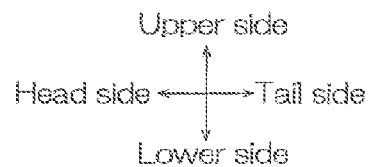
FIG. 7A
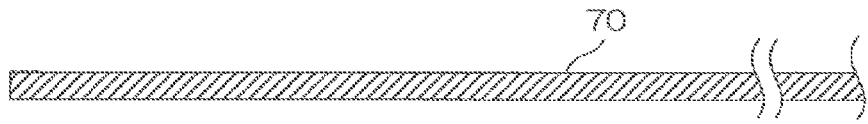
FIG. 7B
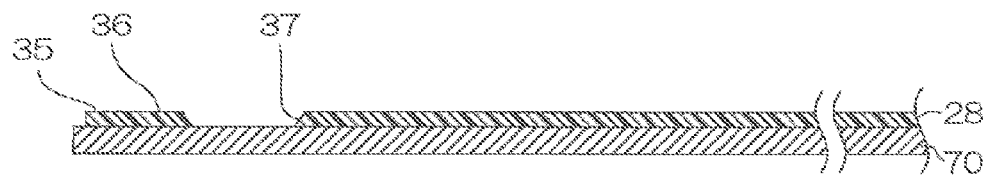
FIG. 7C
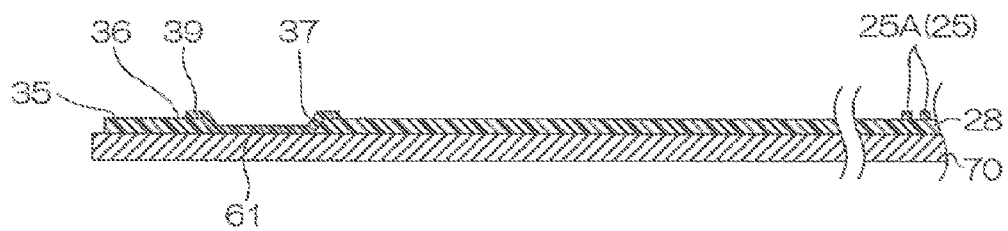
FIG. 7D
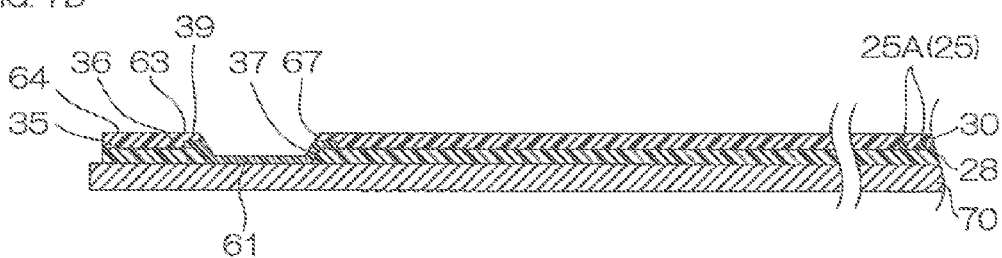
FIG. 7E
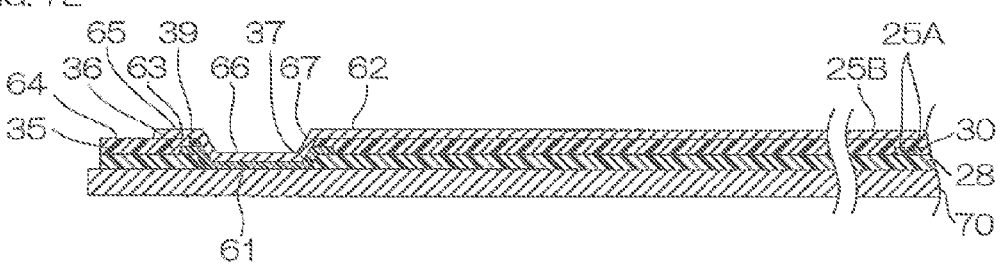

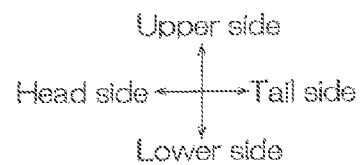
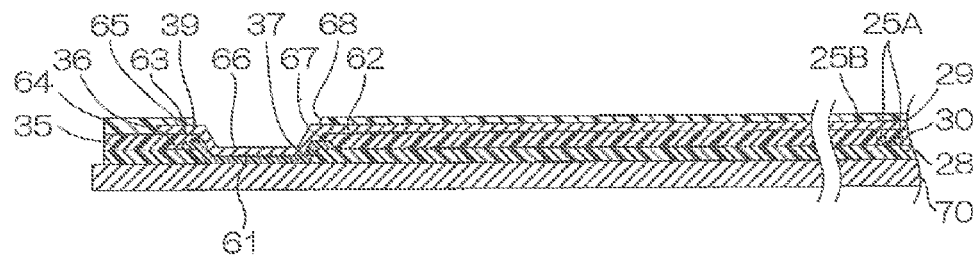
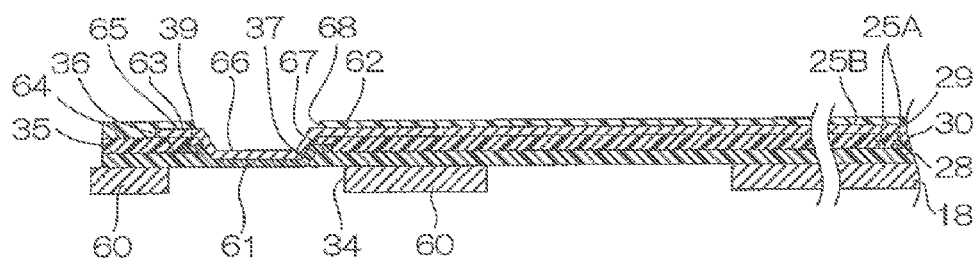
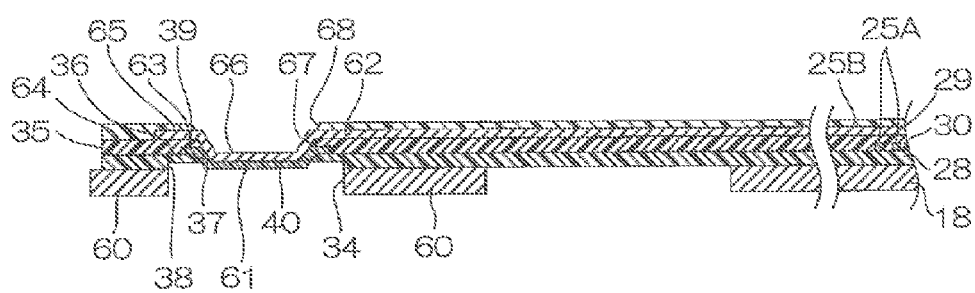
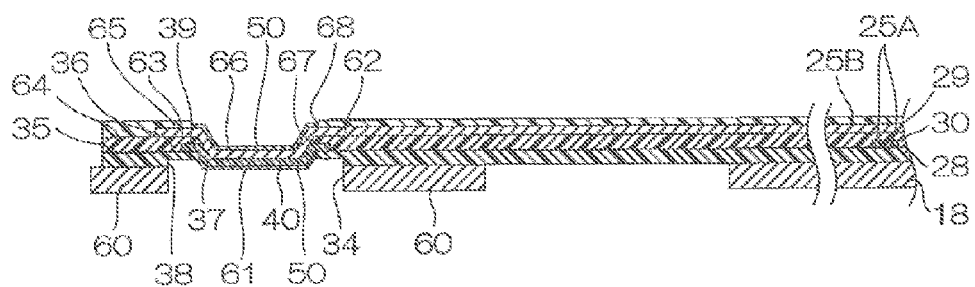

WIRED CIRCUIT BOARD HAVING ONE OF THE CONDUCTIVE LAYERS DISPOSED IN AN OPENING FORMED IN METAL SUPPORTING BOARD

CROSS-REFERENCE TO RELATED APPLICATIONS

The present application is a 35 U.S.C. 371 National Stage Entry of PCT/JP2015/058472, filed on Mar. 20, 2015, which claims priority from Japanese Patent Application No. 2014-087046, filed on Apr. 21, 2014, the contents of both of which are herein incorporated by reference in their entirety.

TECHNICAL FIELD

The present invention relates to a wired circuit board. In particular, the present invention relates to a wired circuit board used for hard disk drives.

BACKGROUND ART

Conventionally, a substrate for suspension including a metal supporting board, a first insulating layer formed on the metal supporting board, a first wire layer formed on the first insulating layer, a second insulating layer formed on the first wire layer, and a second wire layer formed on the second insulating layer has been known.

For such a substrate for suspension, a substrate for suspension including a metal supporting board having a metal supporting board opening, and a flying lead terminal formed at the metal supporting board opening for connecting with an external circuit board is known (ref: e.g., Patent Document 1).

When the substrate for suspension is projected in the thickness direction, the end portion of the metal supporting board opening overlaps with the first wire layer and the second wire layer. In this fashion, for example, when producing the substrate for suspension, breakage of the first wire layer and the second wire layer is suppressed when stress is concentrated on the end portion of the metal supporting board opening.

CITATION LIST

Patent Document

Patent Document 1: U.S. Pat. No. 5,195,956

SUMMARY OF THE INVENTION

Problem to be Solved by the Invention

However, in the substrate for suspension described in Patent Document 1 above, the end portion of the metal supporting board opening overlaps with the first wire layer and the second wire layer when projected in the thickness direction, and therefore it is disadvantageous in that flexibility is difficult to ensure. Therefore, it is disadvantageous in that impacts applied to the substrate for suspension are difficult to be alleviated.

An object of the present invention is to provide a wired circuit board in which damages to the first conductive layer and the second conductive layer can be suppressed, and impacts can be alleviated.

Means for Solving the Problem

A wired circuit board of the present invention includes a metal supporting board having an opening, a first conductive layer disposed on one side in the thickness of the direction of the metal supporting board, and a second conductive layer disposed on one side in the thickness direction of the first conductive layer, wherein one of the first conductive layer and the second conductive layer is disposed in the opening when projected in the thickness direction, and the periphery of the other of the first conductive layer and the second conductive layer is disposed outside of the opening when projected in the thickness direction.

In such a wired circuit board, one of the first conductive layer and the second conductive layer is disposed in the opening when projected in the thickness direction, and the periphery of the other of the first conductive layer and the second conductive layer is disposed outside the opening when projected in the thickness direction.

Therefore, the first conductive layer and the second conductive layer can be disposed in line in the thickness direction, and strength of the first conductive layer and the second conductive layer can be increased.

As a result, damages to the first conductive layer and the second conductive layer can be suppressed.

One of the first conductive layer and the second conductive layer is disposed in the opening when projected in the thickness direction. That is, in the thickness direction, one of the first conductive layer and the second conductive layer does not overlap with the opening.

Therefore, flexibility of the wired circuit board can be ensured, and impacts applied to the wired circuit board can be alleviated.

The periphery of the other of the first conductive layer and the second conductive layer is disposed outside the opening when projected in the thickness direction.

Therefore, strength of the wired circuit board can be ensured.

In the wired circuit board of the present invention, it is preferable that the first conductive layer is disposed in the opening when projected in the thickness direction, and the periphery of the second conductive layer is disposed outside the opening when projected in the thickness direction.

In such a wired circuit board, the first conductive layer is disposed in the opening when projected in the thickness direction.

Therefore, impacts in proximity of the opening can be alleviated.

In the wired circuit board of the present invention, it is preferable that at least a portion of one side face of the first conductive layer in the thickness direction is in contact with the second conductive layer.

With such a wired circuit board, strength of the first conductive layer and the second conductive layer can be further increased at the portion where the first conductive layer contacts the second conductive layer.

In the wired circuit board of the present invention, it is preferable that the first conductive layer is disposed so as to be in spaced-apart relation from the second conductive layer in the thickness direction.

With such a wired circuit board, flexibility of the wired circuit board can further be ensured, and impacts applied on the wired circuit board can further be alleviated.

Effects of the Invention

With the wired circuit board of the present invention, damages to the first conductive layer and the second conductive layer can be suppressed, and impacts can be alleviated.

BRIEF DESCRIPTION OF THE DRAWINGS

FIG. 6 shows an enlarged plan view of a connection arm of the assembly shown in FIG. 1.

FIG. 7A to FIG. 7E show process diagrams illustrating a method for producing a suspension board with circuits, FIG. 7A illustrating a step of preparing a metal support layer, FIG. 7B illustrating a step of forming an insulating base layer, FIG. 7C illustrating a step of forming a lower conductive layer, FIG. 7D illustrating a step of forming an intermediate insulating layer, and FIG. 7E illustrating a step of forming an upper conductive layer.

FIG. 8F to FIG. 8I show, following FIG. 7A to FIG. 7E, process diagrams illustrating a method for producing a suspension board with circuits, FIG. 8F illustrating a step of forming an insulating cover layer, FIG. 8G illustrating a step of forming a metal pedestal portion, FIG. 8H illustrating a step of forming an above-base opening and a below-base opening, and FIG. 8I illustrating a step of forming a plated layer.

DESCRIPTION OF EMBODIMENTS

Figure 1:
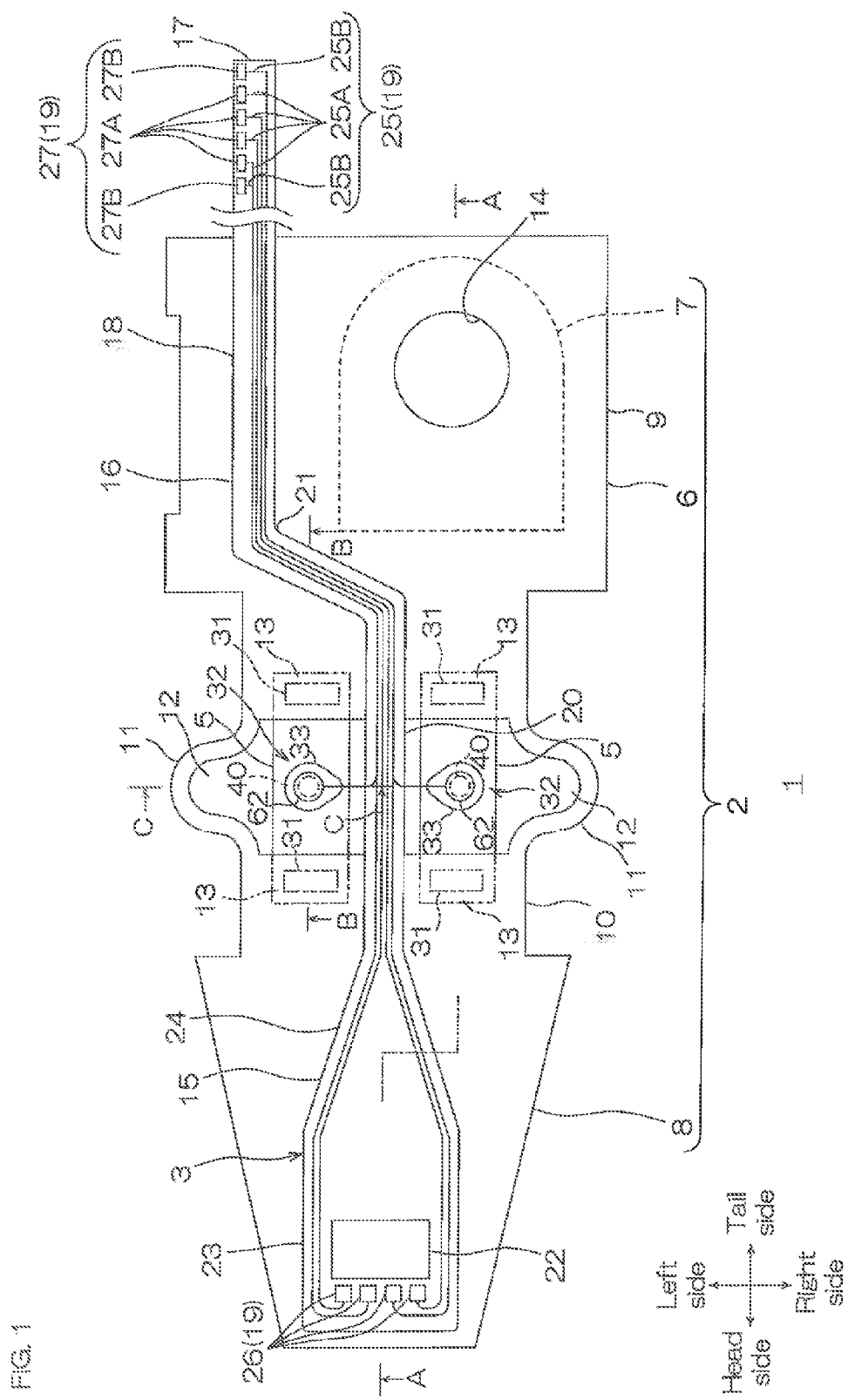
FIG. 1 shows a plan view of an assembly including a first embodiment of the wired circuit board of the present invention.

In FIG. 1, the left-right direction on the plane of the paper is referred to as head-tail direction (first direction), the left side on the plane of the sheet is head-side (one side in the first direction), and the right side on the plane of the sheet is tail-side (the other side in the first direction). In FIG. 1, the up-down direction on the plane of the paper is referred to as left-right direction (width direction, second direction perpendicular to the first direction), the upper side on the plane of the sheet is left side (one side in the width direction, one side in the second direction), and the lower side on the plane of the paper is right side (the other side in the width direction, the other side in the second direction). In FIG. 1, the paper thickness direction on the plane of the paper is referred to as up-down direction (thickness direction, third direction perpendicular to the first direction and the second direction), the front side to the plane of the paper is upper side (one side in the thickness direction, one side in the third direction), the rear side to the plane of the paper is lower side (the other side in the thickness direction, the other side in the third direction). To be specific, directions are in conformity with the direction arrows in each of the figures.

1. Whole Structure of Assembly

Figure 2:
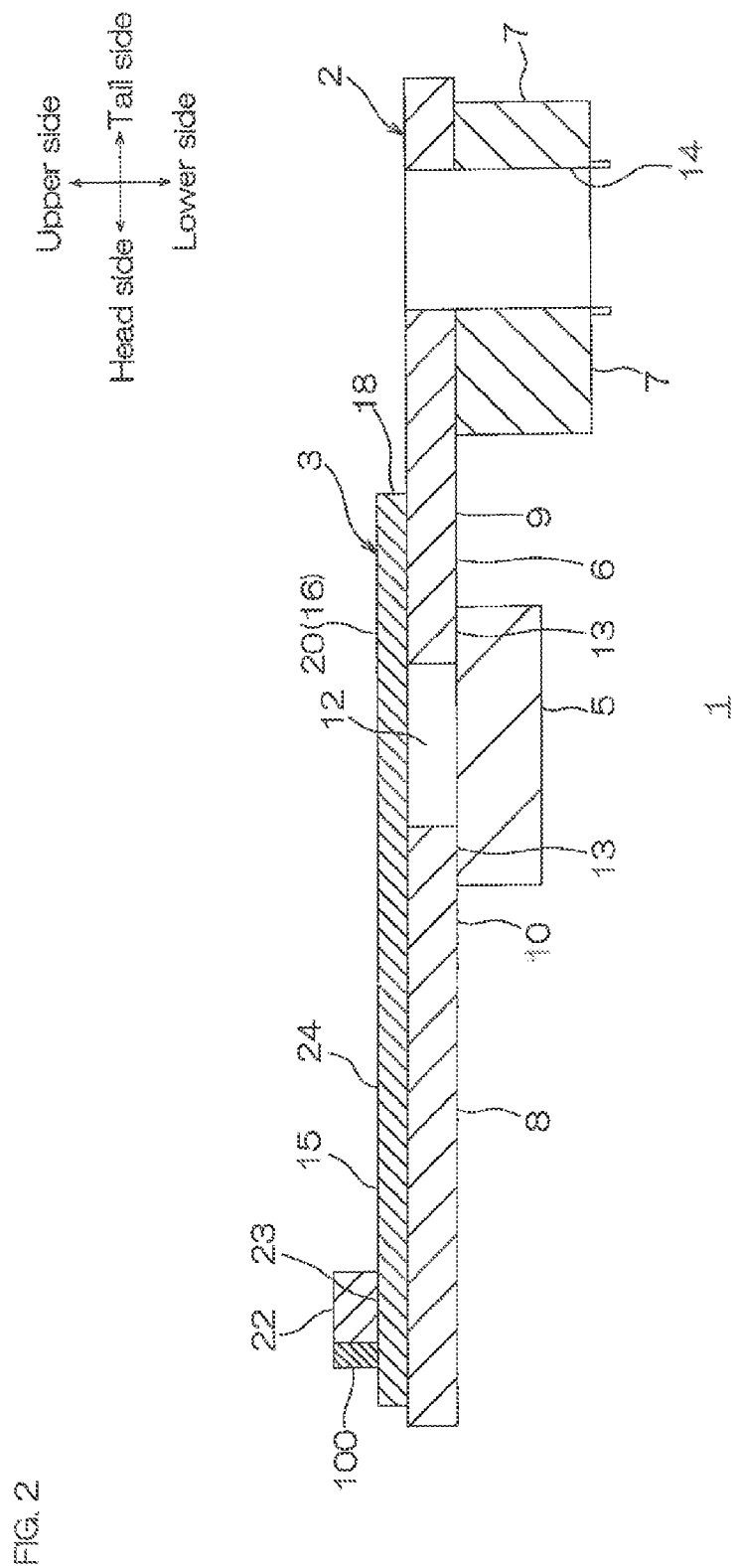
FIG. 2 shows a cross-sectional view along line A-A of the assembly shown in FIG. 1.

An assembly 1 is, as shown in FIGS. 1 and 2, a head stack assembly (HSA), which is mounted in a hard disk drive (not shown): in the assembly 1, a support plate 2 supports a suspension board with circuits 3 as a wired circuit board on which a slider 22 mounting a magnetic head 100 and a piezoelectric element 5 as an electron device are mounted. The assembly 1 includes the support plate 2, and a suspension board with circuits 3 provided on the support plate 2 and supported by the support plate 2.

In FIG. 1, an insulating base layer 28, an intermediate insulating layer 30, and an insulating cover layer 29 to be described later are omitted to clearly show relative positions of a conductive layer 19 to be described later.

The support plate 2 is formed to extend in the head-tail direction, and includes an actuator plate portion 6, a base plate portion 7 provided below the actuator plate portion 6, and a load beam portion 8 provided continuously at the head-side of the actuator plate portion 6.

The actuator plate portion 6 integrally includes a tail-plate portion 9, a head-plate portion 10 provided at the head-side of the tail-plate portion 9 in spaced-apart relation, and a flexible portion 11 provided between the tail-plate portion 9 and the head-plate portion 10.

The tail-plate portion 9 is formed into a generally rectangular shape when viewed from the top at the tail end portion of the actuator plate portion 6.

The head-plate portion 10 is formed into a generally rectangular shape when viewed from the top extending in left-right direction.

The flexible portion 11 is provided at both left and right sides of the actuator plate portion 6. The right side flexible portion 11 is provided so as to bridge the right side portion of the head end portion of the tail-plate portion 9 and the right side portion of the tail end portion of the head-plate portion 10. The left side flexible portion 11 is provided so as to bridge the left side portion of the head end portion of the tail-plate portion 9 and the left side portion of the tail end portion of the head-plate portion 10. Center portions in the head-tail direction of the two flexible portions 11 are bent toward both left and right outer sides, and are formed to be about the same width in the head-tail direction. To be specific, the center portion in the head-tail direction of the flexible portion 11 is formed to project in both left and right outer sides to have a generally letter U shape (or generally letter V shape). Therefore, the flexible portion 11 is configured so that the contraction of the piezoelectric element 5 allows for the head-plate portion 10 to go away and come close relative to the tail-plate portion 9, which is to be described later.

The actuator plate portion 6 is provided with a plate opening 12 that is defined by the head-face of the tail-plate portion 9, the tail-face of the head-plate portion 10, and the inner-face in left-right direction of the flexible portion 11. The plate opening 12 penetrates the actuator plate portion 6 in the thickness direction.

At a head end portion of the tail-plate portion 9 and a tail end portion of the head-plate portion 10, two pairs of attachment regions 13 are defined for the tail end portion and the head end portion of the piezoelectric element 5 to be attached. Each of the two pairs of attachment regions 13 is formed into a generally rectangular shape when viewed from the bottom extending in the head-tail direction, corresponding to the head end portion of the tail-plate portion 9 and the tail end portion of the head-plate portion 10 at the left side portion and the right side portion.

The base plate portion 7 is fixed at a center portion in left-right direction and a center portion in the head-tail direction at the lower face of the tail-plate portion 9. The head portion of the base plate portion 7 is formed into a generally rectangular shape and the tail portion of the base plate portion 7 is formed into a semicircular shape when viewed from the top.

The support plate 2 is provided with a hole 14 having a generally circular shape when viewed from the bottom, the hole 14 penetrating a center portion of the tail-plate portion 9 and a center portion of the base plate portion 7 in the thickness direction.

To the base plate portion 7, a driving coil (not shown) is attached for swinging the head end portion of the assembly 1 with the hole 14 as the center.

The load beam portion 8 is provided integrally with the actuator plate portion 6; to be specific, the load beam portion 8 is formed to extend from the distal end of the head-plate portion 10 to the head-side, and is formed to have a generally trapezoid shape decreasing its width towards the head-side when viewed from the top.

The support plate 2 is formed from, for example, metal materials such as stainless steel, aluminum, iron, and alloys thereof. The size of the support plate 2 is suitably adjusted, and the size is as follows: for example, the actuator plate portion 6 and the load beam portion 8 have a thickness of, for example, 30 μm or more, and for example, 150 μm or less, and the base plate portion 7 has a thickness of, for example, 150 μm or more, and for example, 200 μm or less. The support plate 2 is an actuator plate load beam integrated plate integrally including an actuator plate portion 6 and a load beam portion 8.

2. Suspension Board with Circuits (2-1) General Structure of Suspension Board with Circuits The suspension board with circuits 3 is formed into a generally flat belt shape extending in the head-tail direction when viewed from the top. The suspension board with circuits 3 is provided with, as shown in FIG. 1, a metal supporting board 18 and a conductive layer 19 supported by the metal supporting board 18.

The metal supporting board 18 is formed to correspond to the outline shape of the suspension board with circuits 3, and integrally includes a wire portion 16, a head portion 15 provided at the head-side of the wire portion 16, and a tail portion 17 provided at the tail-side of the wire portion 16.

The wire portion 16 is formed at a center portion in the head-tail direction of the metal supporting board 18, and integrally includes a linear portion 20 extending into the head-tail direction, and a bending portion 21 bending from the tail end portion of the linear portion 20 to the left side, and then bending to the tail-side. The linear portion 20 and the bending portion 21 are formed to have the generally same width along the head-tail direction. The wire portion 16 supports the wire 25 (described later).

The head portion 15 continues from the distal end of the linear portion 20, and formed into a generally rectangular shape when viewed from the top bulging slightly relative to the wire portion 16 toward the both left and right side (outside). To be specific, the head portion 15 include a gimbal 23 on which a slider 22 (described later) is mounted, and a gimbal tail portion 24 which connects the gimbal 23 and the linear portion 20.

The gimbal 23 is formed into a generally rectangular shape when viewed from the top, and has a width larger than the width of the linear portion 20. The gimbal 23 supports the head-side terminal 26 (described later), and a slider 22 (described later) having a magnetic head 100 (ref: FIG. 2) that is electrically connected with the head-side terminal 26 is mounted.

The gimbal tail portion 24 continues to the tail end of the gimbal 23, and is formed into a generally triangular shape decreasing its width toward tail-side. The gimbal tail portion 24 supports the wire 25.

The tail portion 17 continues from the tail end of the bending portion 21, and is formed into a generally rectangular shape when viewed from the top having a width that is generally the same with that of the bending portion 21. The tail portion 17 supports the tail-side terminal 27 (described later).

The conductive layer 19 integrally includes the wire 25 extending along the head-tail direction on the metal supporting board 18, a head-side terminal 26 continuing to the head end portion of the wire 25, and a tail-side terminal 27 continuing to the tail end portion of the wire 25.

The wire 25 includes a signal wiring 25A that transmits an electric signal between the magnetic head 100 (ref: FIG. 2) and the read/write board (not shown), and is disposed across the entire suspension board with circuits 3 in head-tail direction. A plurality (four) of signal wirings 25A are disposed in spaced-apart relation in left-right direction.

The wire 25 further includes a power source wire 25B as a second conductive layer. The power source wire 25B is electrically connected with a power source-side terminal 27B to be described next, and is continued to a power source-side terminal 27B at the tail portion 17. The power source wire 25B is disposed, in proximity to the connection point with the power source-side terminal 27B, in parallel in spaced-apart relation on both sides of the signal wiring 25A, and at a portion from the connection point with the power source-side terminal 27B to the center portion in the head-tail direction of the linear portion 20, disposed above the signal wiring 25A positioned outside the width direction of the suspension board with circuits 3 in spaced-apart relation. That is, at the portion from the proximity of the connection point of the power source-side terminal 27B to the center portion in the head-tail direction of the linear portion 20, the power source wire 25B and the signal wiring 25A positioned outside the width direction of the suspension board with circuits 3 are disposed side by side in up-down direction. The power source wires 25B are disposed so that they are bent both left and right outer sides to reach the pad portion 33 (ref: FIG. 3A and FIG. 3B) described later at the center portion in the head-tail direction of the linear portion 20.

The head-side terminal 26 is disposed at the head portion 15; to be specific, a plurality (four) of head-side terminals 26 are disposed at the head-side of the gimbal 23, along the head end face of the slider 22 in spaced-apart relation in left-right direction. The head-side terminals 26 are head-side terminals to which a magnetic head 100 (ref: FIG. 2) is electrically connected.

The tail-side terminal 27 is disposed at the tail end portion of the tail portion 17; to be specific, a plurality (six) of tail-side terminals 27 are disposed in head-tail direction in spaced-apart relation. The tail-side terminal 27 includes a plurality (four) of external side terminals 27A that continue to the signal wiring 25A, and are connected to the terminal of the read/write board.

The tail-side terminal 27 further includes a plurality of (two) power source-side terminals 27B that continue to the power source wire 25B, and are electrically connected to the piezoelectric element 5. The power source-side terminals 27B are disposed at both head-tail sides of the external side terminal 27A in spaced-apart relation, and are electrically connected to a power source (not shown).

(2-2) Layer Structure of Suspension Board with Circuits

Figure 3:
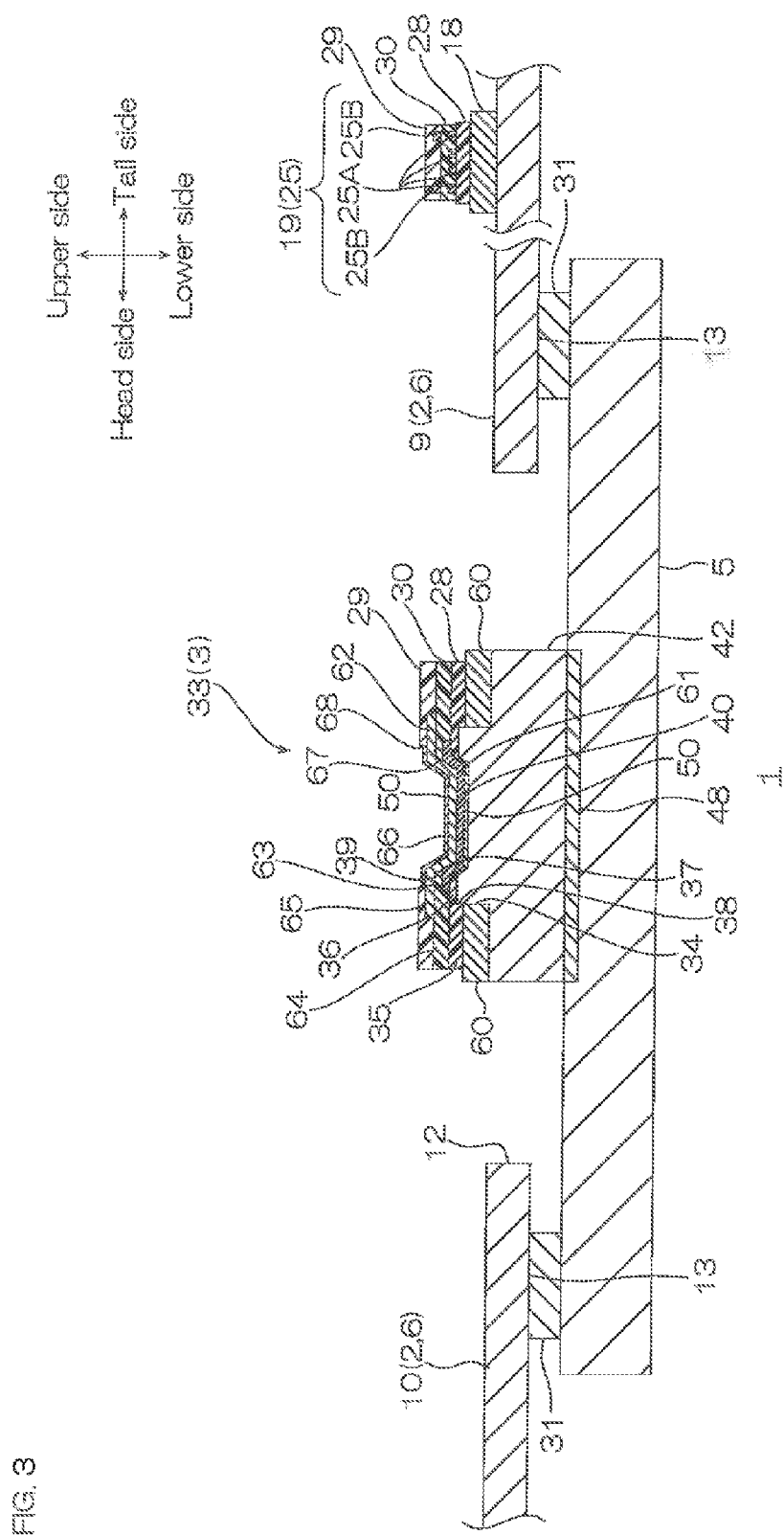
FIG. 3 shows a cross-sectional view along line B-B of the assembly shown in FIG. 1.
Figure 4:
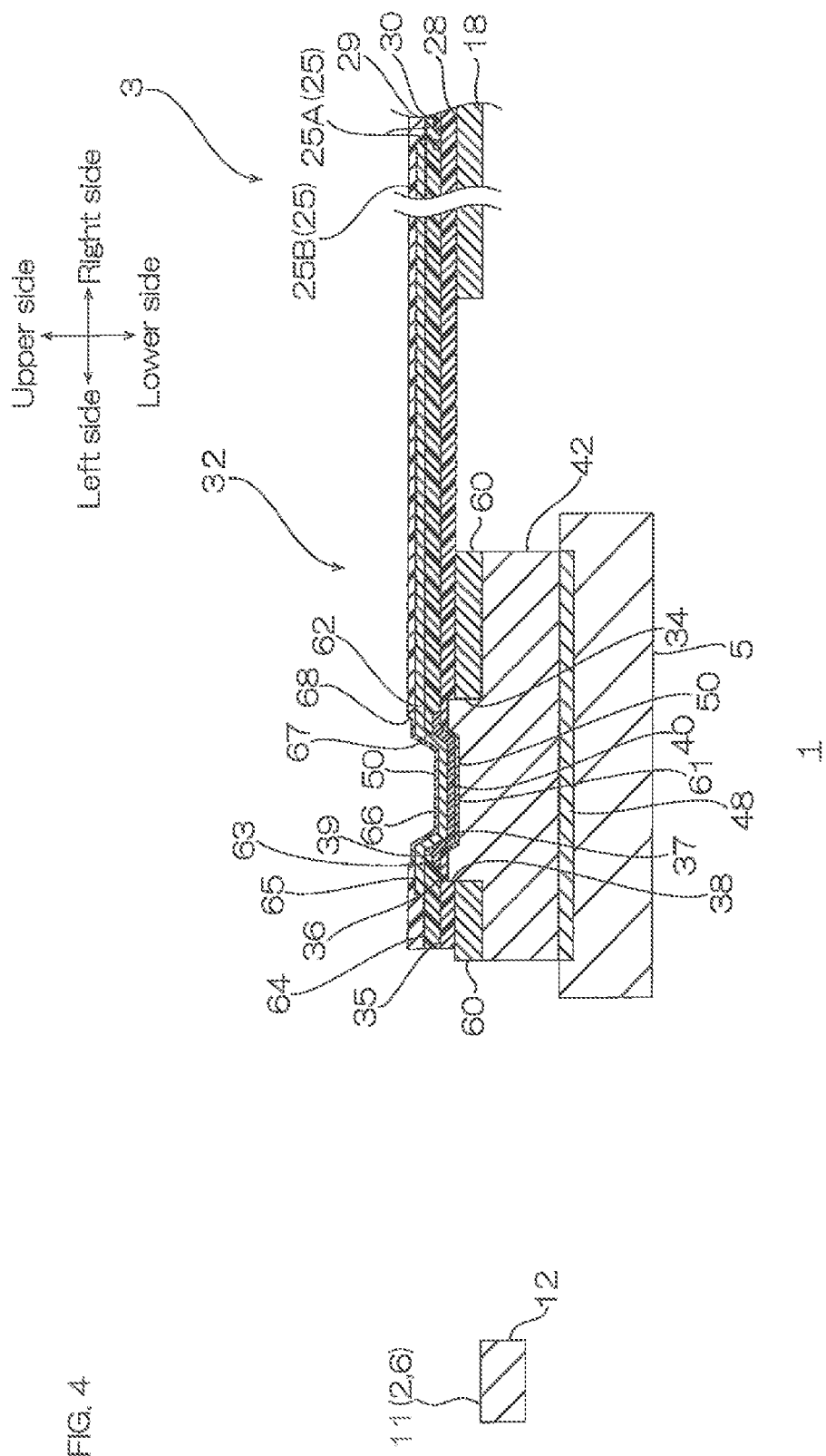
FIG. 4 shows a cross-sectional view along line C-C of the assembly shown in FIG. 1.

As shown in FIGS. 3 and 4, the suspension board with circuits 3 includes, at the tail-side half portion, the above-described metal supporting board 18, the insulating base layer 28 provided thereon, the above-described signal wiring 25A (conductive layer 19) provided on the insulating base layer 28, the intermediate insulating layer 30 provided on the insulating base layer 28 so as to cover the signal wiring 25A, the above-described power source wire 25B (conductive layer 19) formed on the intermediate insulating layer 30, the insulating cover layer 29 provided on the intermediate insulating layer 30 so as to cover the power source wire 25B (conductive layer 19).

At the head-side half portion of the suspension board with circuits 3, the power source wire 25B (conductive layer 19) is not formed on the intermediate insulating layer 30 but the insulating cover layer 29 is formed.

The metal supporting board 18 is formed from, for example, metal materials such as stainless steel, 42 alloy, aluminum, copper-beryllium, and phosphor bronze. Preferably, the metal supporting board 18 is formed from stainless steel. The metal supporting board 18 has a thickness of, for example, 10 μm or more, preferably 12 μm or more, more preferably 15 μm or more, and for example, 30 μm or less, preferably 25 μm or less, preferably 20 μm or less.

The insulating base layer 28 is formed into a pattern matching to the conductive layer 19 on the upper face of the metal supporting board 18 at the head portion 15, the wire portion 16, and the tail portion 17 of FIG. 1. The insulating base layer 28 is formed from, for example, insulating materials such as synthetic resin including polyimide resin, polyamide-imide resin, acrylic resin, polyethemitrile resin, polyether sulfone resin, polyethylene terephthalate resin, polyethylenenaphthalate resin, and polyvinyl chloride resin. Preferably, the insulating base layer 28 is formed from polyimide resin. The insulating base layer 28 has a thickness (maximum thickness) of, for example, 1 μm or more, preferably 2 μm or more, more preferably 3 μm or more, and for example, 25 μm or less, preferably 20 μm or less, more preferably 15 μm or less.

The conductive layer 19 is formed into the above-described pattern on the upper face of the insulating base layer 28 and the upper face of the intermediate insulating layer 30 (described later) at the head portion 15, the wire portion 16, and the tail portion 17 of FIG. 1. The conductive layer 19 is formed from, for example, conductive materials such as copper, nickel, gold, solder, or alloys thereof. Preferably, the conductive layer 19 is formed from copper. The conductive layer 19 has a thickness of, for example, 1 μm or more, preferably 2 μm or more, more preferably 3 μm or more, and for example, 25 μm or less, preferably 20 μm or less, more preferably 15 μm or less. The plurality of wires 25 each has a width of, for example, 5 μm or more, preferably 8 μm or more, for example, 200 μm or less, preferably 100 μm or less, and the interval between the plurality of wires 25 when viewed from the top is, for example, 5 μm or more, preferably 8 μm or more, and for example, 1000 μm or less, preferably 100 μm or less. The interval between the wires 25 disposed in line in up-down direction is, for example, 2 μm or more, preferably 4 μm or more, and for example, 15 μm or less, preferably 10 μm or less. The head-side terminal 26 and the tail-side terminal 27 have a width and a length of, for example, 20 μm or more, preferably 30 μm or more, and for example, 1000 μm or less, preferably 800 μm or less. The interval between the plurality of head-side terminals 26 and the interval between the plurality of tail-side terminals 27 are, for example, 20 μm or more, preferably 30 μm or more, and for example, 1000 μm or less, preferably 800 μm or less.

The intermediate insulating layer 30 is formed so as to cover the upper face of the insulating base layer 28 at the surrounding of the wire 25 and the side face and the upper face of the wire 25 formed on the insulating base layer 28 at the head portion 15, the wire portion 16, and the tail portion 17 of FIG. 1. The intermediate insulating layer 30 is formed into a pattern that allows, at the head portion 15 of FIG. 1, the head-side terminal 26 to expose, and at the tail portion 17, the tail-side terminal 27 to expose. The intermediate insulating layer 30 is formed from an insulating material that is the same as the insulating material of the insulating base layer 28. The intermediate insulating layer 30 has a thickness of, for example, 2 μm or more, preferably 4 μm or more, and for example, 12 μm or less, preferably 10 μm or less.

The insulating cover layer 29 is formed, at a portion from the center portion in the head-tail direction of the linear portion 20 to the tail portion 17 of FIG. 1, so as to cover the upper face of the intermediate insulating layer 30 surrounding the wire 25 and the upper face and the side face of the wire 25. The insulating cover layer 29 is formed, at a portion from the center portion in the head-tail direction of the linear portion 20 to the head portion 15 of FIG. 1, on the upper face of the intermediate insulating layer 30. The insulating cover layer 29 is formed into a pattern that allows, at the head portion 15 of FIG. 1, the head-side terminal 26 to expose, and at the tail portion 17, allows the tail-side terminal 27 to expose. The insulating cover layer 29 is formed from the insulating material that is the same as the insulating material of the insulating base layer 28. The insulating cover layer 29 has a thickness of, for example, 1 μm or more, preferably 2 μm or more, more preferably 3 μm or more, and for example, 10 μm or less, preferably 8 μm or less, more preferably 6 μm or less.

3. Disposal of Suspension Board with Circuits in Assembly

In the suspension board with circuits 3 of the assembly 1, as shown in FIGS. 1 and 2, the lower face of the metal supporting board 18 is supported by the support plate 2. To be specific, the lower face of the wire portion 16 and the head portion 15 is supported by the support plate 2, and the lower face of the tail portion 17 protrudes to the tail-side from the support plate 2 without being supported by the support plate 2.

To be specific, the suspension board with circuits 3 is disposed such that the bending portion 21 is disposed generally in letter L shape along the left end portion and the head end portion of the tail-plate portion 9, and the linear portion 20 passes through from the center portion in left-right direction of the head end portion of the tail-plate portion 9 to the center portion in left-right direction of the plate opening 12, and thereafter, reaches the center portion in left-right direction of the head-plate portion 10. The suspension board with circuits 3 is disposed such that the head portion 15 is formed along the head-tail direction of the load beam portion 8 at the center portion in left-right direction of the load beam portion 8.

In the suspension board with circuits 3, a piezoelectric element 5 is mounted. That is, suspension board with circuits 3 includes the piezoelectric element 5.

The piezoelectric element 5 is attached below the support plate 2. To be specific, the plurality of (two) piezoelectric elements 5 are provided in spaced-apart relation in left-right direction. The two piezoelectric elements 5 are actuators (piezoelectric element) that are expandable and shrinkable in head-tail direction, and are formed into a generally rectangular shape when viewed from the top extending in head-tail direction. The piezoelectric element 5 is disposed so as to across the plate opening 12 in the head-tail direction. To be specific, both end portions in head-tail direction of the two piezoelectric elements 5 are adhered and fixed to the attachment region 13 (ref: broken line in FIG. 1) at the head end portion of the tail-plate portion 9 and at the tail end portion of the head-plate portion 10 by an adhesive layer 31 (ref: broken line in FIG. 1).

As shown in FIG. 3, an electrode 48 is provided at the center portion in the head-tail direction of the upper face of the two piezoelectric elements 5, and the electrode 48 is bonded to a pad portion 33 to be described next.

To the pair of the piezoelectric elements 5, electricity is supplied from the conductive layer 19, and shrinkage occurs by controlling the voltage.

4. Connection Arm

Next, a connection arm 32 in the suspension board with circuits 3 is described with reference to FIG. 3, FIG. 4, FIG. 5, and FIG. 6.

In FIG. 6, the insulating cover layer 29 and the intermediate insulating layer 30 are omitted to clearly show the structure of the connection arm.

The suspension board with circuits 3 is provided with, as shown in FIG. 1, a pair of connection arms 32.

The pair of connection arms 32 is provided at both left and right outer sides so as to protrude like an arm from the center portion in the head-tail direction of the linear portion 20. To be specific, the left side connection arm 32 protrudes from the linear portion 20 to the left side. The right side connection arm 32 protrudes from the linear portion 20 to the right side. The right side connection arm 32 is configured to be axisymmetric with the left side connection arm 32 relative to the linear portion 20. Therefore, in the following, description for the right side connection arm 32 is omitted and the left side connection arm 32 is described in detail.

As shown in FIG. 6, the connection arm 32 includes a pad portion 33 disposed on the left of the linear portion 20 in spaced-apart relation, and a joint portion 41 joining the linear portion 20 and the pad portion 33.

Figure 5:
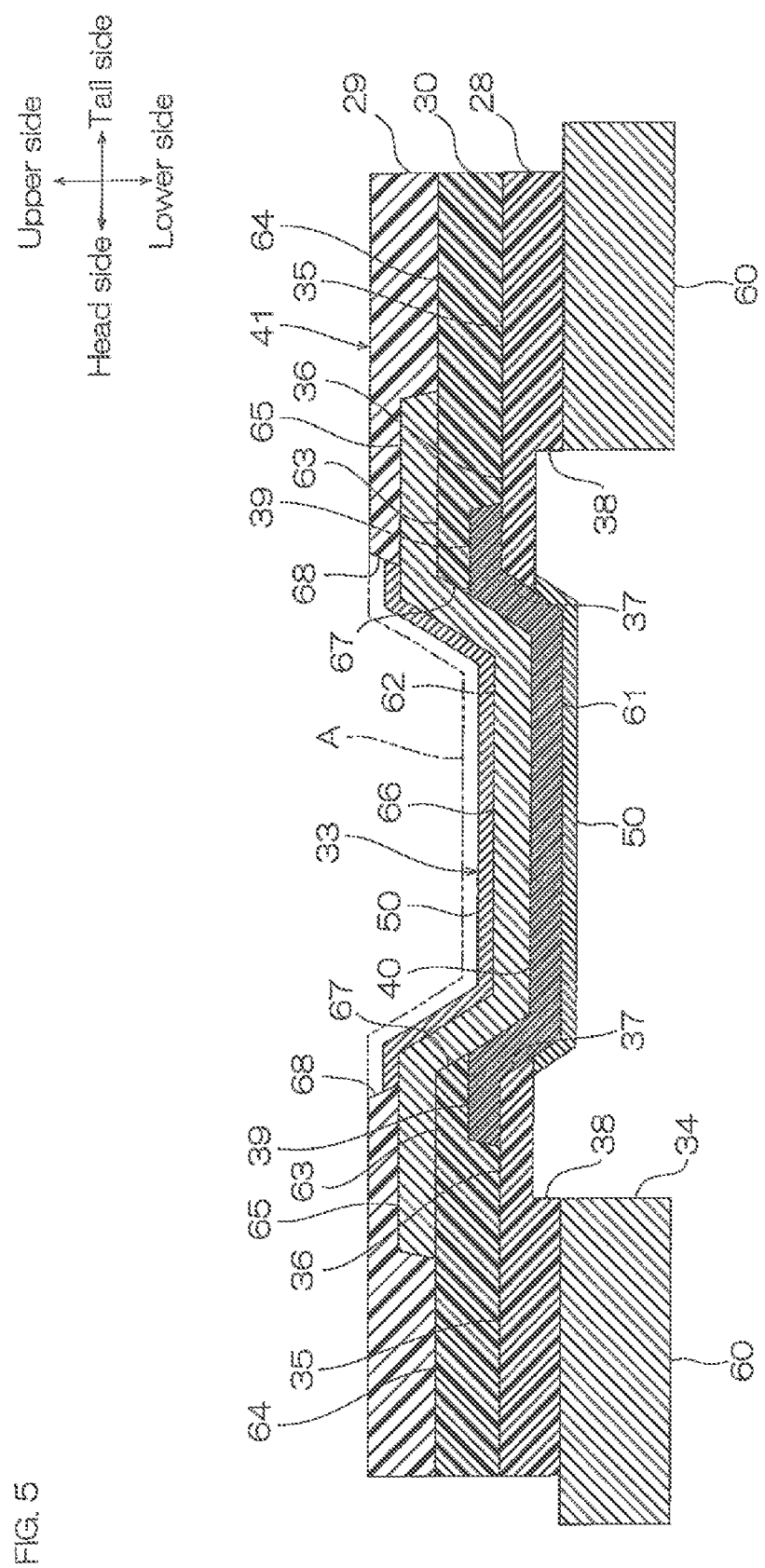
FIG. 5 shows an enlarged cross-sectional view of a pad portion of the assembly shown in FIG. 3.

As shown in FIGS. 3 and 5, the pad portion 33 includes a metal pedestal portion 60, an insulating base layer 28 formed on the metal pedestal portion 60, a lower conductive layer 61 as a first conductive layer formed at the base inner peripheral portion 36 (described later) of the insulating base layer 28, an intermediate insulating layer 30 formed on the insulating base layer 28 so as to cover the lower side frame conductor 39 (described later) of the lower conductive layer 61, an upper conductive layer 62 as a second conductive layer formed on the intermediate insulating layer 30 and the piezoelectric-side terminal 40 (described later) of the lower conductive layer 61, and an insulating cover layer 29 formed on the intermediate insulating layer 30 so as to cover the upper side frame conductor 65 (described later) of the upper conductive layer 62.

As shown in FIG. 6, the metal pedestal portion 60 is formed into a generally drop shape frame from which a drop is forming toward the right. As shown in FIGS. 5 and 6, at a center portion of the metal pedestal portion 60, a pedestal opening 34 penetrating in the thickness direction and having a generally circular shape when viewed from the top is formed. The right side portion of the metal pedestal portion 60 protrudes toward the right side. The metal pedestal portion 60 is formed from a metal material that is the same as that of the metal supporting board 18, and its thickness is the same as the thickness of the metal supporting board 18.

The metal pedestal portion 60 is disposed at the same position in up-down direction as that of the metal supporting board 18.

The insulating base layer 28 is formed into a generally ring shape when viewed from the top. The external diameter of the insulating base layer 28 is formed so as to be smaller than the external diameter of the metal pedestal portion 60. At a center portion of the insulating base layer 28, an above-base opening 37 penetrating into the thickness direction and having a generally circular shape when viewed from the top is formed. When projected in up-down direction, the above-base opening 37 is disposed at an inner side of the pedestal opening 34. To be specific, the above-base opening 37 is disposed so as to be concentric with the pedestal opening 34, and the internal diameter of the above-base opening 37 is formed to be smaller than the internal diameter of the pedestal opening 34 of the metal pedestal portion 60.

As shown in FIG. 5, the insulating base layer 28 of the pad portion 33 includes a base inner peripheral portion 36, which defines the above-base opening 37 with its inner peripheral end face, and a base outer peripheral portion 35 defined outside the base inner peripheral portion 36. The base inner peripheral portion 36 is formed to be thinner than the base outer peripheral portion 35. To be specific, the base inner peripheral portion 36 has a thickness of, for example, 0.5 to 5 μm.

At an inner side of the base outer peripheral portion 35, below the base inner peripheral portion 36, a below-base opening 38 is formed. The below-base opening 38 is disposed to be concentric with the above-base opening 37, and is formed so that its internal diameter is larger than the internal diameter of the above-base opening 37.

The below-base opening 38 communicates with the pedestal opening 34. To be specific, the below-base opening 38 is formed so as to overlap with the pedestal opening 34 when projected in up-down direction. That is, the inner periphery of the below-base opening 38 is formed to be flush with the inner periphery of the pedestal opening 34 in up-down direction.

The lower conductive layer 61 is formed into a generally disk shape when viewed from the top, and into a generally inverted hat shape in cross section having a center portion depressing downward relative to the peripheral end portion. The lower conductive layer 61 includes a lower side frame conductor 39 formed on the upper face of the base inner peripheral portion 36 of the insulating base layer 28, and a piezoelectric-side terminal 40 continuing to the inner side of the lower side frame conductor 39, and positioned lower than the lower side frame conductor 39.

The lower side frame conductor 39 is formed into a ring shape when viewed from the top, which is smaller than the below-base opening 38 of the insulating base layer 28 and the pedestal opening 34 of the metal pedestal portion 60 when projected in up-down direction. That is, the lower conductive layer 61 is disposed in the below-base opening 38 of the insulating base layer 28 and the pedestal opening 34 of the metal pedestal portion 60 when projected in up-down direction.

The piezoelectric-side terminal 40 is formed, as shown in FIGS. 5 and 6, when viewed from the top, into a generally circular shape continuing to the inner peripheral portion of the lower side frame conductor 39 when viewed from the top. The piezoelectric-side terminal 40 is formed, as shown in FIG. 5, into a step from the inner peripheral portion of the lower side frame conductor 39 passing in the above-base opening 37 of the insulating base layer 28, further depressing downward. The lower face of the piezoelectric-side terminal 40 is disposed, at the same position in up-down direction, with the lower face of the base outer peripheral portion 35 of the insulating base layer 28, and the upper face of the metal pedestal portion 60. The lower face of the piezoelectric-side terminal 40 is exposed from the pedestal opening 34 of the metal pedestal portion 60, and the below-base opening 38 of the insulating base layer 28.

In the pad portion 33, the intermediate insulating layer 30 covers the lower side frame conductor 39 of the lower conductive layer 61 and the base outer peripheral portion 35 of the insulating base layer 28.

In the pad portion 33, the intermediate insulating layer 30 is formed into a ring shape when viewed from the top, and its outline shape is the same as the outline shape of the insulating base layer 28 when viewed from the top.
At a center position of the intermediate insulating layer 30 of the pad portion 33, an intermediate opening 67 penetrating in the thickness direction is formed. The intermediate opening 67 is formed so as not to overlap with the piezoelectric-side terminal 40, and so as to overlap with the lower side frame conductor 39 of the lower conductive layer 61 when projected in up-down direction.

The intermediate insulating layer 30 at the pad portion 33 includes an intermediate inner peripheral portion 63, which defines the intermediate opening 67 with its inner peripheral end face, and an intermediate outer peripheral portion 64 defined outside the intermediate inner peripheral portion 63. The intermediate inner peripheral portion 63 is formed to be thinner than the intermediate outer peripheral portion 64. To be specific, the intermediate inner peripheral portion 63 has a thickness of, for example, 1.5 to 5 µm.

The upper conductive layer 62 is, as shown in FIG. 1, a portion of the power source wire 25B, which bends to the left from the proximity of the center portion in the head-tail direction of the linear portion 20 of the metal supporting board 18 in the suspension board with circuits 3. The upper conductive layer 62 is a generally disk shape when viewed from the top, and into a generally inverted hat shape in cross section having a center portion depressing downward relative to the peripheral end portion. As shown in FIG. 5, the upper conductive layer 62 includes an upper side frame conductor 65 formed on the upper face of the intermediate inner peripheral portion 63 of the intermediate insulating layer 30, and an upper side terminal 66 continuing to the inner side of the upper side frame conductor 65, and positioned lower than the upper side frame conductor 65.

The upper side frame conductor 65 is formed into a generally ring shape when viewed from the top, being larger than the below-base opening 38 of the insulating base layer 28 and the pedestal opening 34 of the metal pedestal portion 60 when projected in up-down direction. That is, the periphery of the upper conductive layer 62 is disposed, when projected in up-down direction, outside the below-base opening 38 of the insulating base layer 28 and the pedestal opening 34 of the metal pedestal portion 60.

The upper side terminal 66 is formed, as shown in FIGS. 5 and 6, when viewed from the top, into a generally circular shape continuing to the inner peripheral portion of the upper side frame conductor 65 when viewed from the top. The upper side terminal 66 is formed, as shown in FIG. 5, into a step from the inner peripheral portion of the upper side frame conductor 65, depressing toward the intermediate opening 67 of the intermediate insulating layer 30 and to the upper face of the piezoelectric-side terminal 40 of the lower conductive layer 61. The lower face of the upper side terminal 66 is in contact with the upper face of the piezoelectric-side terminal 40. The upper face of the upper side terminal 66 is exposed from the cover opening 68 (described later) of the insulating cover layer 29.

In the pad portion 33, the insulating cover layer 29 covers the upper side frame conductor 65 of the upper conductive layer 62 and the intermediate outer peripheral portion 64 of the intermediate insulating layer 30.

In the pad portion 33, as shown in FIG. 5, the insulating cover layer 29 has a generally ring shape when viewed from the top, and is formed so that its outline shape is the same shape as the outline shape of the insulating base layer 28 when viewed from the top.
At a center portion of the insulating cover layer 29 at the pad portion 33, a cover opening 68 penetrating in the thickness direction is formed. From the cover opening 68, the upper side terminal 66 of the upper conductive layer 62 is exposed. The cover opening 68 is formed so as to overlap with the lower side frame conductor 39 of the lower conductive layer 61 when projected in up-down direction.

The size of the pad portion 33 is suitably selected. The metal pedestal portion 60 has an external diameter (maximum length) of, for example, 60 µm or more, preferably 100 µm or more, and for example, 1500 µm or less, preferably 1300 µm or less. The metal pedestal portion 60 has an internal diameter (external diameter (maximum length) of the pedestal opening 34) of, the same as the internal diameter (external diameter (maximum length) of below-base opening 38) of the base outer peripheral portion 35 of the insulating base layer 28.

The distance between the outer periphery of the metal pedestal portion 60 and the inner periphery of the pedestal opening 34 is, for example, 10 µm or more, preferably 20 µm or more, and for example, 200 µm or less, preferably 150 µm or less.

The (base outer peripheral portion 35 of the) insulating base layer 28 has an external diameter (maximum length) of, for example, 50 µm or more, preferably 90 µm or more, and for example, 1450 µm or less, preferably 1250 µm or less. The base inner peripheral portion 36 of the insulating base layer 28 has an internal diameter (external diameter (maximum length) of above-base opening 37) of, for example, 20 µm or more, preferably 50 µm or more, and for example, 1200 µm or less, preferably 1000 µm or less. The base outer peripheral portion 35 of the insulating base layer 28 has an internal diameter (external diameter (maximum length) of the below-base opening 38) of, for example, 30 µm or more, preferably 70 µm or more, and for example, 1350 µm or less, preferably 1150 µm or less.

The lower side frame conductor 39 of the lower conductive layer 61 has an external diameter (maximum length) of, for example, 25 µm or more, preferably 60 µm or more, and for example, 1300 µm or less, preferably 1100 µm or less. The piezoelectric-side terminal 40 has an external diameter (maximum length) of the same as the external diameter (maximum length) of the above-base opening 37.

The intermediate insulating layer 30 has an external diameter (maximum length) of the same as the external diameter (maximum length) of the insulating base layer 28, and the intermediate opening 67 of the intermediate insulating layer 30 has an internal diameter (maximum length) that is the same as the internal diameter (external diameter (maximum length) of the above-base opening 37) of the base inner peripheral portion 36 of the insulating base layer 28.

The upper side frame conductor 65 of the upper conductive layer 62 has an external diameter (maximum length) of, for example, 40 µm or more, preferably 80 µm or more, and for example, 1400 µm or less, preferably 1200 µm or less.

The external diameter (maximum length) of the upper side terminal 66 is the same as the external diameter (maximum length) of the above-base opening 37.

The external diameter (maximum length) of the insulating cover layer 29 is the same as the external diameter (maximum length) of the insulating base layer 28, and the cover opening 68 of the insulating cover layer 29 has an internal diameter (maximum length) that is the same as the internal diameter (external diameter (maximum length) of the above-base opening 37) of the base inner peripheral portion 36 of the insulating base layer 28.

The joint portion 41 bridges, as shown in FIGS. 5 and 6, the left end portion of the center portion in the head-tail direction of the linear portion 20 and the right end portion of the pad portion 33.

The joint portion 41 extends in left-right direction, and is formed into a generally rectangular shape having a width smaller than the external diameter of the pad portion 33 when viewed from the top.

The joint portion 41 includes an insulating base layer 28, an intermediate insulating layer 30 (omitted in FIG. 6) formed on the insulating base layer 28, a power source wire 25B formed on the intermediate insulating layer 30, and an insulating cover layer 29 (omitted in FIG. 6) formed on the intermediate insulating layer 30 so as to cover the power source wire 25B.

As shown in FIG. 6, in the joint portion 41, the insulating base layer 28 is formed into a generally rectangular shape when viewed from the top, and formed so that the insulating base layer 28 of the linear portion 20 is continuous with the insulating base layer 28 of the pad portion 33.

In the joint portion 41, the intermediate insulating layer 30 is formed on the insulating base layer 28 so that its outline shape is the same as the outline shape of the insulating base layer 28.

The power source wire 25B in the joint portion 41 is formed on the intermediate insulating layer 30 at the joint portion 41 so as to extend along left-right direction, and is formed so as to be continuous with the power source wire 25B of the linear portion 20, and the upper conductive layer 62 of the pad portion 33.

In the joint portion 41, the insulating cover layer 29 is formed on the intermediate insulating layer 30 so that its outline shape is the same as the outline shape of the insulating base layer 28. In the joint portion 41, the insulating cover layer 29 covers the upper face and the side face of the power source wire 25B.

In the pad portion 33, on the lower face of the piezoelectric-side terminal 40, and the upper face of the upper side terminal 66 of the upper conductive layer 62, a plated layer 50 is formed. Although not shown, in the suspension board with circuits 3, the plated layer is formed also on the terminals, to be specific, on the surface of the head-side terminal 26 (ref: FIG. 1) and the tail-side terminal 27 (ref: FIG. 1).

The plated layer 50 is formed from, for example, metal materials such as nickel and gold. Preferably, the plated layer 50 is formed from gold. The plated layer 50 has a thickness of, 0.01 μm or more, preferably 0.1 μm or more, and for example, 10 μm or less, preferably 5 μm or less.

5. Production Method of Assembly

Next, description is given below of a method for producing the assembly 1.

To produce the assembly 1, first, a suspension board with circuits 3, a support plate 2, and a piezoelectric element 5 are prepared.

Next, description is given below of a method for preparing (producing) a suspension board with circuits 3 with reference to FIG. 7A to FIG. 7E and FIG. 8F to FIG. 8I.

In this method, as shown in FIG. 7A, first, a metal support layer 70 is prepared.

The metal support layer 70 is a substrate for forming a metal supporting board 18 and a metal pedestal portion 60, and the materials and the thickness are the same as those for the above-described metal supporting board 18 and metal pedestal portion 60.

Then, as shown in FIG. 7B, an insulating base layer 28 is formed on the metal support layer 70.

At this time, an above-base opening 37 is formed on the insulating base layer 28.

To form the insulating base layer 28, first, for example, varnish of a photosensitive insulating material is applied and dried on the upper face of the metal support layer 70, thereby forming a photosensitive base coating.

Then, the photosensitive base coating is exposed to light with an interposing photomask, which is not shown. The photomask includes a pattern of shield portion and transmittance portion, and is disposed on the base coating so that the shield portion faces the portion where the insulating base layer 28 is not formed (portion where the above-base opening 37 is formed) and the transmittance portion faces the portion where the insulating base layer 28 is formed.

Thereafter, the base coating exposed to light is developed, and subjected to thermosetting as necessary, thereby forming the insulating base layer 28 into the above-described pattern including the above-base opening 37.

Then, as shown in FIG. 7C, the lower conductive layer 61, and the conductive layer 19 are formed on the upper face of the insulating base layer 28.

To be specific, the lower conductive layer 61 is formed on the surface of the metal support layer 70 in the above-base opening 37, and the base inner peripheral portion 36. At the same time, the conductive layer 19 is formed into a pattern including a signal wiring 25A formed on the insulating base layer 28 and a head-side terminal 26 and an external side terminal 27A continued therefrom.

The lower conductive layer 61, and the signal wiring 25A of the conductive layer 19 are formed by, for example, additive method or subtractive method.

Then, as shown in FIG. 7D, the intermediate insulating layer 30 is formed in the same manner as the insulating base layer 28 in the above-described pattern.

Then, as shown in FIG. 7E, the power source wire 25B of the conductive layer 19 is formed on the upper face of the intermediate insulating layer 30.

To be specific, as shown in FIG. 1, the conductive layer 19 is formed into a pattern including the power source wire 25B formed on the intermediate insulating layer 30, and the power source-side terminal 27B and the upper side terminal 66 continued therefrom.

The power source wire 25B of the conductive layer 19 is formed by, for example, additive method or subtractive method.

Then, as shown in FIG. 8F, the insulating cover layer 29 is formed into the above-described pattern in the same manner as the insulating base layer 28.

Then, as shown in FIG. 8G, the metal support layer 70 is trimmed, thereby forming the metal supporting board 18 and metal pedestal portion 60 having the above-described pattern.

To be specific, the metal support layer 70 is formed by, for example, etching such as dry etching (e.g., plasma etching) or wet etching (e.g., chemical etching), and for example, drilling, and laser processing, into the shape of the metal supporting board 18 and the metal pedestal portion 60. Preferably, the metal support layer 70 is trimmed by wet etching.

Then, as shown in FIG. 8H, the insulating base layer 28 exposed from the pedestal opening 34 of the metal pedestal portion 60 is partially removed.

The insulating base layer 28 is removed, for example, by etching, preferably, and wet etching.

In this manner, a lower portion of the base inner peripheral portion 36 and the above-base opening 37 is removed. Then, the below-base opening 38 is formed.

In this manner, the piezoelectric-side terminal 40 exposed from the above-base opening 37 and the below-base opening 38 is formed.

Thereafter, as shown in FIG. 8I, the plated layer 50 is formed on the head-side terminal 26 (ref: FIG. 1), the tail-side terminal 27 (ref: FIG. 1), the lower face of the piezoelectric-side terminal 40, and the upper face of the upper side terminal 66 by, for example, plating such as electroless plating, and electrolytic plating, preferably by electrolytic plating.

In this manner, the suspension board with circuits 3 is prepared (produced).

Then, as shown in FIGS. 1 and 2, the prepared suspension board with circuits 3, the support plate 2, and the piezoelectric element 5 are assembled.

To be specific, the suspension board with circuits 3 is disposed on the upper face of the support plate 2. That is, as shown in FIG. 1, the suspension board with circuits 3 is fixed to the support plate 2, for example, by welding or by an adhesive so that the linear portion 20 in the wire portion 16 crosses the center portion in width direction of the plate opening 12, the bending portion 21 is disposed at the one end portion in the width direction and the head end portion of the tail-plate portion 9, and the head portion 15 is disposed at a center portion in the width direction of the load beam portion 8 across the head-tail direction of the load beam portion 8. Furthermore, the suspension board with circuits 3 is fixed to the support plate 2 so that the connection arm 32 is disposed to the both end portions in width direction of the plate opening 12.

Thereafter, as shown in FIG. 3, the piezoelectric element 5 is fixed to the support plate 2, and the electrode 48 of the piezoelectric element 5 is supported to the metal pedestal portion 60.

To fix the piezoelectric element 5 to the support plate 2, the adhesive layer 31 is provided in the attachment region 13 in the actuator plate portion 6, and through the adhesive layer 31, both end portions in the head-tail direction of the piezoelectric element 5 is attached to the attachment region 13. The piezoelectric elements 5 are disposed in spaced-apart relation, as shown in FIG. 1, in the plate opening 12, at both outer sides in width direction of the linear portion 20 of the suspension board with circuits 3.

To allow the metal pedestal portion 60 to support the electrode 48 of the piezoelectric element 5, as shown in FIG. 3, an electrically conductive adhesive 42 is provided at the pedestal opening 34 and the below-base opening 38.

The electrically conductive adhesive 42 is, for example, an adhesive medium (e.g., electrically conductive pastes such as gold paste and silver paste) that exhibits adhesive effects by heating with a relatively low temperature (e.g., 100 to 200° C.).

The amount of the electrically conductive adhesive 42 is set to an amount that allows the pedestal opening 34 and the below-base opening 38 to be filled, and furthermore, allows the electrically conductive adhesive 42 to overflow from the pedestal opening 34, and allows the electrically conductive adhesive 42 to cover at least the lower face of the metal pedestal portion 60. That is, the amount is set to an amount that is larger than the total volume of the pedestal opening 34 and the below-base opening 38. The amount of the electrically conductive adhesive 42 is set, for example, to 110 to 1000%, preferably 300 to 800% relative to the total volume of the pedestal opening 34 and the below-base opening 38.

The electrically conductive adhesive 42 fills the pedestal opening 34 and the below-base opening 38, and is provided at the lower face of the metal pedestal portion 60, and the electrode 48 of the piezoelectric element 5 makes contact with the electrically conductive adhesive 42.

The piezoelectric-side terminal 40 and the metal pedestal portion 60 are adhered to the electrode 48 through the electrically conductive adhesive 42.

In this manner, the electrode 48 is supported by the metal pedestal portion 60.

Then, as shown in FIG. 4, the piezoelectric-side terminal 40 is electrically connected with the electrode 48 through the plated layer 50 and the electrically conductive adhesive 42. In this manner, the power source wire 25B is electrically connected with the electrode 48 through the upper side terminal 66, the piezoelectric-side terminal 40, and the electrically conductive adhesive 42.

Furthermore, as shown in FIGS. 1 and 2, the slider 22 on which a magnetic head (not shown) is mounted is mounted on the gimbal 23 to electrically connect the magnetic head 100 with the head-side terminal 26.

Furthermore, the read/write board (not shown) is electrically connected with the external side terminal 27A, and the power source (not shown) is electrically connected with the power source-side terminal 27B.

The driving coil (not shown) is attached to the base plate portion 7.

Then, in this manner, the assembly 1 is produced. The assembly 1 is mounted in a hard disk drive (not shown).

In the hard disk drive, the slider 22 of the assembly 1 runs relative to the circumferential direction of the rotating disk-shaped hard disk while slightly floating in spaced-apart relation from the surface of the hard disk, and the magnetic head (not shown) reads and writes information based on the driving of the driving coil while moving in the radial direction of the hard disk.

Furthermore, with expansion and contraction of the piezoelectric element 5, positions of the magnetic head relative to the hard disk drive are adjusted precisely.

That is, electricity is supplied from the power source (not shown) through the power source-side terminal 27B, the power source wire 25B, the upper side terminal 66, and the piezoelectric-side terminal 40, and the left side piezoelectric element 5 contracts by the control of the voltage of electricity. Then, the head end portion of the tail-plate portion 9 and the tail end portion of the head-plate portion 10 in the left end portion come close to each other while being flexibly supported by the flexible portion 11.

At the same time, electricity is supplied from the power source (not shown) through the power source-side terminal 27B, the power source wire 25B, the upper side terminal 66, and the piezoelectric-side terminal 40, and the right side piezoelectric element 5 extends by the control of the voltage of electricity. Then, the head end portion of the tail-plate portion 9 and the tail end portion of the head-plate portion 10 in the right end portion go away from each other while being flexibly supported by the flexible portion 11.

Then, the head-plate portion 10 and the load beam portion 8 swings toward the one side in the width direction with the center portion in width direction of the head end portion of the tail-plate portion 9 as the supporting point. At the same time, the suspension board with circuits 3 and the slider 22 fixed to the load beam portion 8 swings toward the one side in the width direction.

Meanwhile, the extension on the left side piezoelectric element 5 and the contraction on the right side piezoelectric element 5 allow the head-plate portion 10 and the load beam portion 8 to swing in the direction opposite to the above-described direction.

6. Operations and Effects

With the suspension board with circuits 3, as shown in FIG. 5, the lower conductive layer 61 is disposed in the pedestal opening 34 of the metal pedestal portion 60 when projected in up-down direction, and the periphery of the upper conductive layer 62 is disposed outside of the pedestal opening 34 of the metal pedestal portion 60 when projected in up-down direction.

Therefore, the lower conductive layer 61 and the upper conductive layer 62 can be disposed in line in up-down direction, and their strength can be increased.

As a result, damages to the lower conductive layer 61 and the upper conductive layer 62 can be suppressed.

That is, even if a force in up-down direction is applied to the lower conductive layer 61 and the upper conductive layer 62 in the pad portion 33 at the time of bonding of the piezoelectric element 5 to the suspension board with circuits 3, the force can be received by the lower conductive layer 61 and the upper conductive layer 62, and therefore damages to the lower conductive layer 61 and the upper conductive layer 62, for example, opening of holes in the lower conductive layer 61 and the upper conductive layer 62 can be suppressed.

The lower conductive layer 61 is disposed in the pedestal opening 34 of the metal pedestal portion 60 when projected in up-down direction. That is, in up-down direction, the lower conductive layer 61 does not overlap with the pedestal opening 34 of the metal pedestal portion 60.

Therefore, flexibility of the suspension board with circuits 3 can be ensured, and impact to the suspension board with circuits 3 can be alleviated.

For example, in production of the suspension board with circuits 3, when a force is applied in proximity to the pedestal opening 34 of the metal pedestal portion 60, particularly with the insulating base layer 28 and the intermediate insulating layer 30, the impacts can be alleviated.

The periphery of the upper conductive layer 62 is disposed outside the pedestal opening 34 of the metal pedestal portion 60 when projected in up-down direction.

Therefore, strength of the suspension board with circuits 3 can be ensured.

With the suspension board with circuits 3, as shown in FIG. 5, of the lower conductive layer 61 and the upper conductive layer 62, the lower conductive layer 61 is disposed in the pedestal opening 34 of the metal pedestal portion 60 when projected in up-down direction.

Therefore, in the suspension board with circuits 3, impacts in the proximity of the pedestal opening 34 of the metal pedestal portion 60 can be alleviated.

That is, the insulating base layer 28 and the intermediate insulating layer 30 are disposed above the pedestal opening 34 of the metal pedestal portion 60.

Therefore, the insulating base layer 28 and the intermediate insulating layer 30 allow impacts in the proximity of the metal pedestal portion 60 and the pedestal opening 34 to be alleviated.

7. Modified Examples of Suspension Board with Circuits

Modified examples of the suspension board with circuits are described with reference to FIG. 5, and FIG. 9 to FIG. 11. In modified examples, those members that are the same as those in the above-described embodiment are given the same reference numerals, and descriptions thereof are omitted.

(1) Second Embodiment

In the above-described first embodiment, as shown with the solid line in FIG. 5, the insulating cover layer 29 in the pad portion 33 covers the upper side frame conductor 65 of the upper conductive layer 62 and the intermediate outer peripheral portion 64 of the intermediate insulating layer 30.

In contrast, in the second embodiment, the insulating cover layer 29 in the pad portion 33 covers, as shown with the phantom line A in FIG. 5, the entire upper face of the upper side terminal 66, that is, the entire upper face of the upper conductive layer 62.

To be specific, in the second embodiment, the plated layer 50 is not formed on the upper face of the upper conductive layer 62 in FIG. 5, and the insulating cover layer 29 is formed so as to cover the entire upper face of the upper conductive layer 62 and the intermediate outer peripheral portion 64 of the intermediate insulating layer 30.

With the suspension board with circuits 3 in the second embodiment, the insulating cover layer 29 is formed on the entire upper face of the upper conductive layer 62.

Therefore, the upper conductive layer 62 can be protected with the insulating cover layer 29.

In the pad portion 33, the lower conductive layer 61, the upper conductive layer 62, and the insulating cover layer 29 are disposed in line when projected in up-down direction.

Therefore, strength of the lower conductive layer 61 and the upper conductive layer 62 can further be increased.

(2) Third Embodiment

In the above-described first embodiment, as shown in FIG. 5, the entire lower face of the upper side terminal 66 in the pad portion 33 is in contact with the entire upper face of the piezoelectric-side terminal 40.

Figure 9:
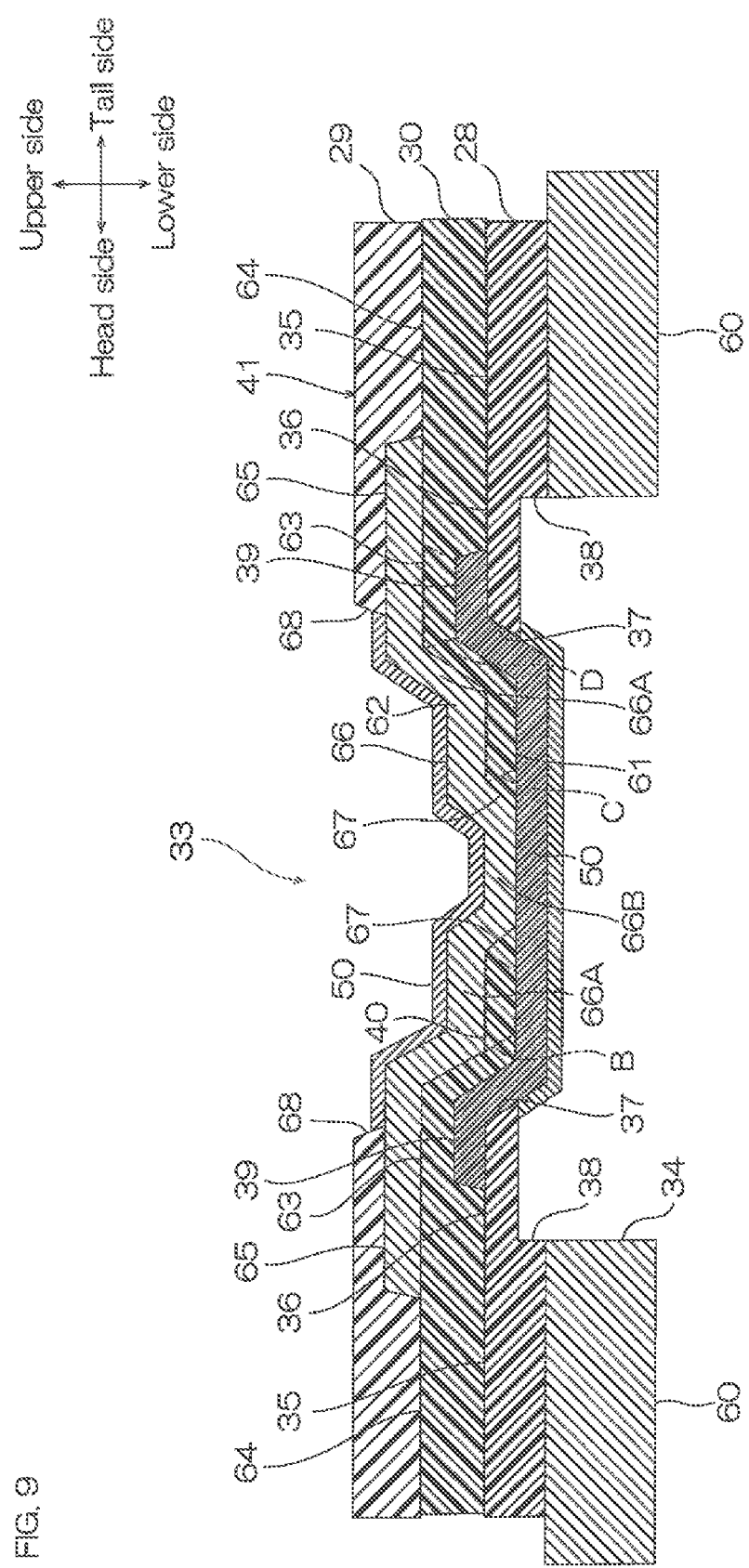
FIG. 9 is a cross sectional view illustrating a third embodiment of the suspension board with circuits shown in FIG. 1.

In contrast, in the third embodiment, as shown in FIG. 9, a portion of the lower face of the upper side terminal 66 in the pad portion 33 is in contact with the upper face of the piezoelectric-side terminal 40.

To be specific, in the third embodiment, in the pad portion 33, the intermediate insulating layer 30 covers the lower side frame conductor 39 of the lower conductive layer 61 and the base outer peripheral portion 35 of the insulating base layer 28, and furthermore, covers up to the proximity to the center portion of the piezoelectric-side terminal 40 of the lower conductive layer 61. In other words, the intermediate insulating layer 30 covers the portion excluding the upper face center portion of the piezoelectric-side terminal 40 relative to the lower conductive layer 61. That is, when projected in up-down direction, the inner peripheral portion (intermediate opening 67) of the intermediate insulating layer 30 is disposed in the projection plane of the piezoelectric-side terminal 40 of the lower conductive layer 61.

The upper conductive layer 62 is formed on the upper face of the intermediate insulating layer 30 and the upper face of the center portion of the piezoelectric-side terminal 40 of the lower conductive layer 61.

In this manner, at the upper side terminal 66 of the upper conductive layer 62, the upper side terminal non-contact portion 66A, which depresses from the inner peripheral portion of the upper side frame conductor 65 slightly downward like a step, and then disposed above the piezoelectric-side terminal 40 of the lower conductive layer 61 in spaced-apart relation, and the upper side terminal contact portion 66B which depresses from the inner peripheral portion (intermediate opening 67) of the upper side terminal non-contact portion 66A like a step and makes contact with the upper face of the piezoelectric-side terminal 40, are formed.

The upper side terminal non-contact portion 66A has a generally ring shape when viewed from the top, and forms the outer peripheral portion of the upper side terminal 66.

The upper side terminal contact portion 66B has a generally circular shape when viewed from the top, and forms the center portion of the upper side terminal 66. Then, the lower face of the upper side terminal contact portion 66B makes contact with the center portion of the piezoelectric-side terminal 40.

With the suspension board with circuits 3 of the third embodiment, at the portion where the piezoelectric-side terminal 40 makes contact with the upper side terminal contact portion 66B of the upper side terminal 66, strength of the piezoelectric-side terminal 40 and the upper side terminal 66 can be improved more.

The intermediate insulating layer 30 is interposed between the piezoelectric-side terminal 40 and the upper side terminal non-contact portion 66A of the upper side terminal 66.

Therefore, flexibility of the suspension board with circuits 3 can be ensured more, and impacts applied to the suspension board with circuits 3 can be alleviated.

In the third embodiment, the upper side terminal contact portion 66B can make contact with the head-side portion of the piezoelectric-side terminal 40, and as shown with the phantom line B, and as shown with the phantom line C, can make contact with the tail-side portion of the piezoelectric-side terminal 40, and as shown with the phantom line D, can make contact with the lower side frame conductor 39 of the lower conductive layer 61.

(3) Fourth Embodiment

In the above-described first embodiment, as shown in FIG. 5, at the pad portion 33, the lower conductive layer 61 is disposed in the pedestal opening 34 of the metal pedestal portion 60, and the periphery of the upper conductive layer 62 is disposed outside the pedestal opening 34 of the metal pedestal portion 60 when projected in up-down direction.

Figure 10:
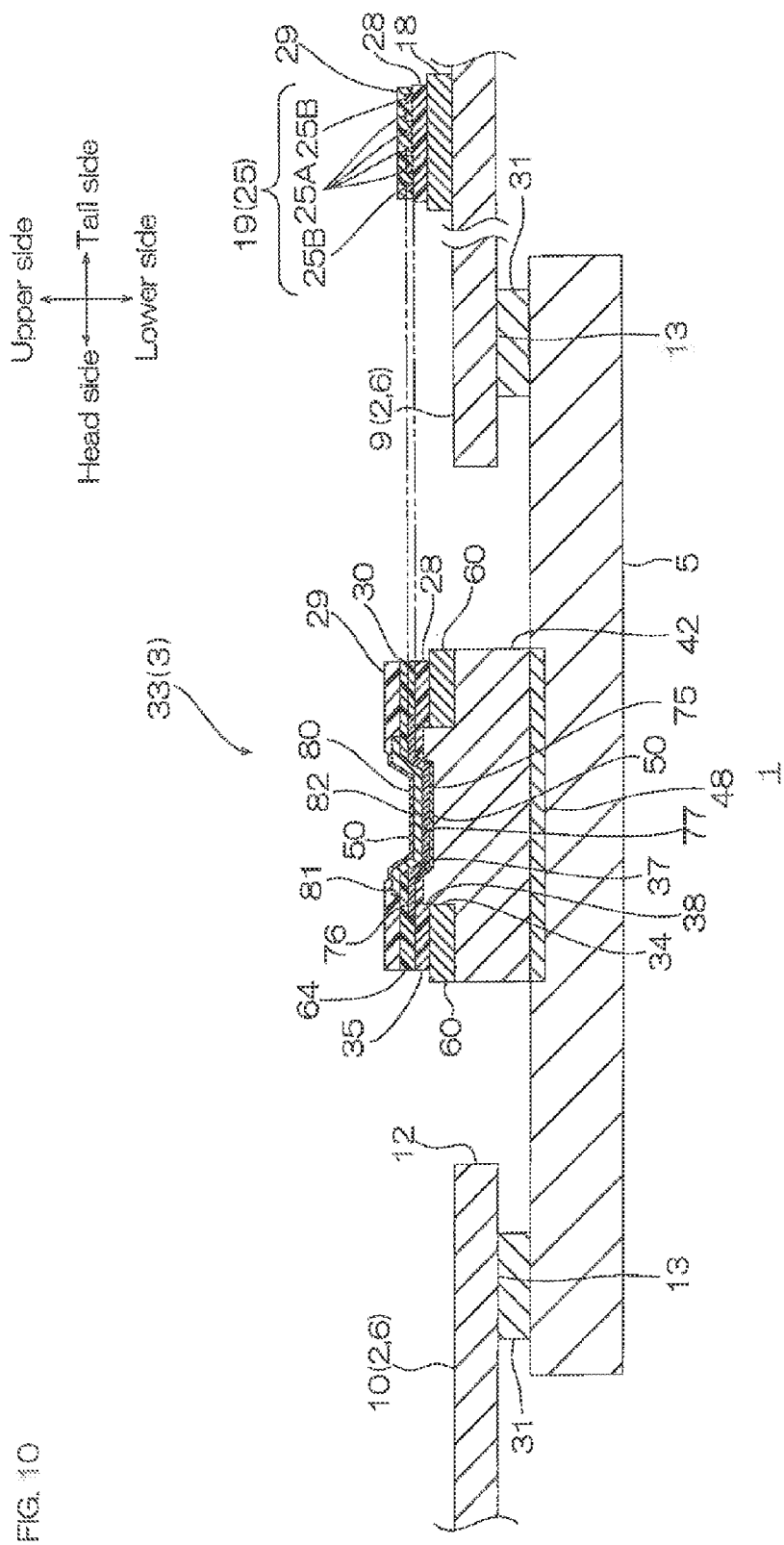
FIG. 10 is a cross sectional view illustrating a fourth embodiment of the suspension board with circuits shown in FIG. 1.

In contrast, in the fourth embodiment, as shown in FIG. 10, at the pad portion 33, the periphery of the lower conductive layer 75 that is disposed below is disposed outside the pedestal opening 34 of the metal pedestal portion 60, and the upper conductive layer 80 disposed above is disposed in the pedestal opening 34 of the metal pedestal portion 60 when projected in up-down direction.

To be specific, in the fourth embodiment, as shown in FIG. 10, the pad portion 33 includes the lower conductive layer 75, and the upper conductive layer 80 disposed above the lower conductive layer 75.

The lower conductive layer 75 is a portion of the power source wire 25B in FIG. 1. The lower conductive layer 75 includes the lower side frame conductor 76 formed on the upper face of the base inner peripheral portion 36 of the insulating base layer 28, and the piezoelectric-side terminal 77 as the terminal continuing to the inner side of the lower side frame conductor 76.

The lower side frame conductor 76 is formed into a generally ring shape when viewed from the top, which is larger than the below-base opening 38 of the insulating base layer 28 and the pedestal opening 34 of the metal pedestal portion 60 when projected in up-down direction. That is, the periphery of the lower conductive layer 75 is disposed outside the below-base opening 38 of the insulating base layer 28 and the pedestal opening 34 of the metal pedestal portion 60 when projected in up-down direction.

The upper conductive layer 80 includes the upper side frame conductor 81 formed at the upper face of the intermediate inner peripheral portion 63 of the intermediate insulating layer 30 and the upper side terminal 82 as the terminal continuing to the inner side of the upper side frame conductor 81.

The upper side frame conductor 81 is formed into a generally ring shape when viewed from the top, which is smaller than the below-base opening 38 of the insulating base layer 28 and the pedestal opening 34 of the metal pedestal portion 60 when projected in up-down direction. That is, the periphery of the upper conductive layer 80 is disposed in the below-base opening 38 of the insulating base layer 28, and the pedestal opening 34 of the metal pedestal portion 60 when projected in up-down direction. In other words, the periphery of the upper conductive layer 80 does not overlap with the below-base opening 38 of the insulating base layer 28 and the pedestal opening 34 of the metal pedestal portion 60 when projected in up-down direction.

In the suspension board with circuits 3 of the fourth embodiment, the periphery of the lower conductive layer 75 in the proximity of the pedestal opening 34 of the metal pedestal portion 60 is disposed outside of the below-base opening 38 of the insulating base layer 28 and the pedestal opening 34 of the metal pedestal portion 60 when projected in up-down direction.

Therefore, strength of the suspension board with circuits 3 can be increased at the proximity of the pedestal opening 34 of the metal pedestal portion 60.

In the fourth embodiment, at the center portion in the head-tail direction of the linear portion 20 to the tail portion 17 of the suspension board with circuits 3, the power source wire 25B is not disposed above the signal wiring 25A, but disposed at both outer sides of the signal wiring 25A disposed outside in width direction of the suspension board with circuits 3.

In this manner, in the suspension board with circuits 3, the configuration of the signal wiring 25A and the power source wire 25B can be easily made. In this case, the power source wire 25B in FIG. 1 is always formed on the insulating base layer 28 in the suspension board with circuits 3. The intermediate insulating layer 30 is formed only on the pad portion 33.

(4) Fifth Embodiment

In the above-described fourth embodiment, as shown in FIG. 10, at the pad portion 33, the piezoelectric-side terminal 77 of the lower conductive layer 75 makes contact with the upper side terminal 82 of the upper conductive layer 80.

Figure 11:
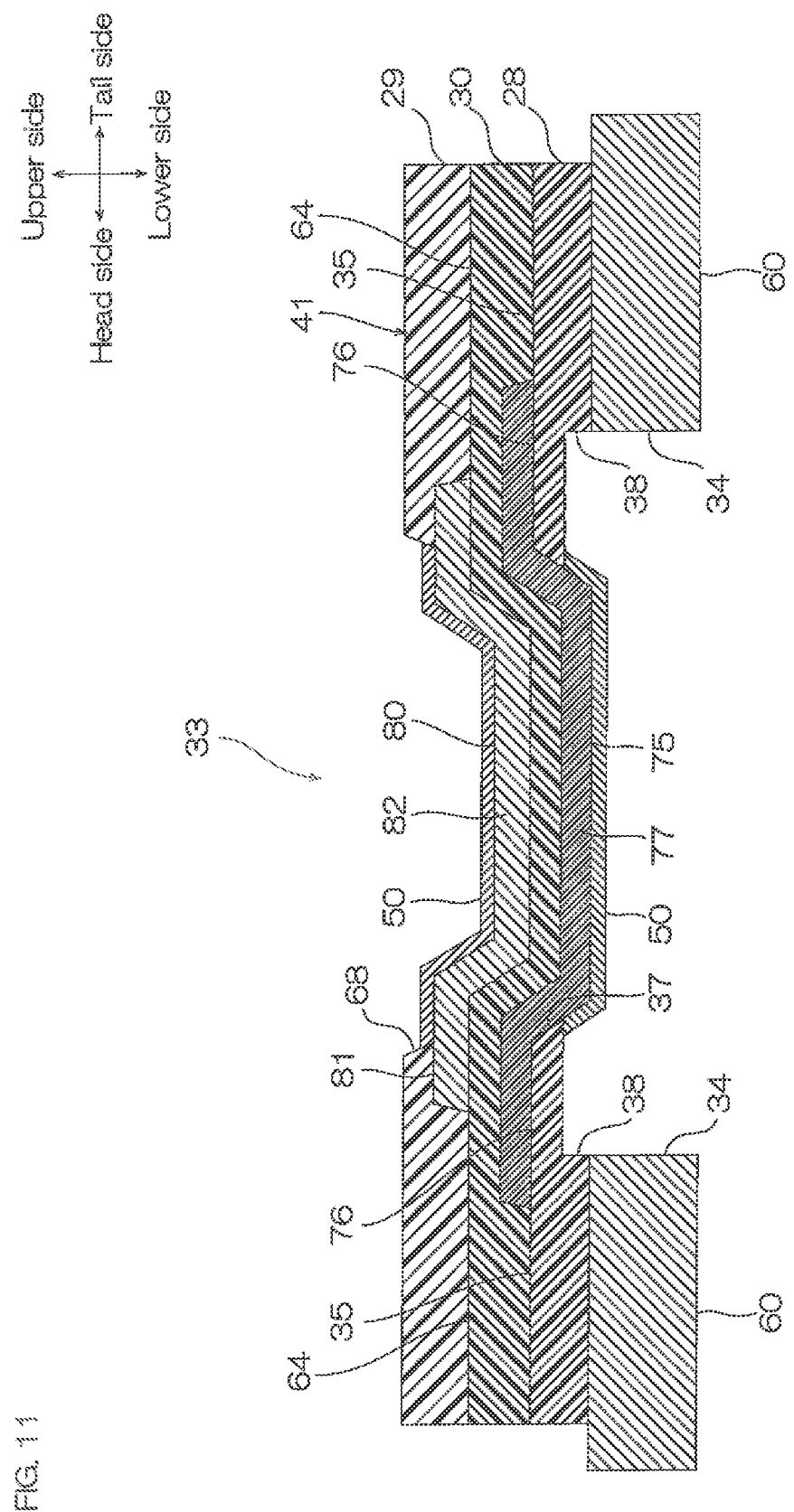
FIG. 11 is a cross sectional view illustrating a fifth embodiment of the suspension board with circuits shown in FIG. 1.

In contrast, in the fifth embodiment, as shown in FIG. 11, at the pad portion 33, the intermediate insulating layer 30 is interposed between the piezoelectric-side terminal 77 of the lower conductive layer 75 and the upper side terminal 82 of the upper conductive layer 80.

To be specific, in the fifth embodiment, at the pad portion 33, the intermediate insulating layer 30 covers the base outer peripheral portion 35 of the insulating base layer 28, and covers the entire upper face of the lower conductive layer 75. That is, in the fifth embodiment, the intermediate opening 67 is not formed at the intermediate insulating layer 30.

Then, the upper conductive layer 80 is formed on the intermediate insulating layer 30. The upper conductive layer 80 is disposed above the lower conductive layer 75 in spaced-apart relation.

In the suspension board with circuits 3 of the fifth embodiment, the upper conductive layer 80 and the lower conductive layer 75 are disposed in spaced-apart relation in up-down direction, and the intermediate insulating layer 30 is interposed therebetween.

Therefore, flexibility of the suspension board with circuits 3 can be ensured more, and impacts applied to the suspension board with circuits 3 can be alleviated more.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wired circuit board of the present invention is used in, for example, a hard disk drive.

DESCRIPTION OF REFERENCE NUMERAL

3 suspension board with circuits
18 metal supporting board
19 conductive layer
25B power source wire
34 pedestal opening
60 metal pedestal portion
61 lower conductive layer
65 upper side frame conductor
66B upper side terminal contact portion
75 lower conductive layer
80 upper conductive layer

The invention claimed is:

1. A wired circuit board comprising:
a metal supporting board having an opening;
a first insulating layer disposed on one side in a thickness direction of the metal supporting board and having an insulating opening disposed in the opening when projected in the thickness direction;
a first conductive layer having a peripheral portion disposed on one side face in the thickness direction of a peripheral portion of the insulating opening in the first insulating layer, and a terminal continuing to an inner side of the peripheral portion and disposed in the insulating opening so as to be exposed from the opening;
a second insulating layer disposed on the first insulating layer so as to cover at least the peripheral portion of the first conductive layer; and
a second conductive layer having a peripheral portion disposed on the second insulating layer, and an inner side portion continuing to the inner side of the peripheral portion of the second conductive layer and overlapping with the terminal when projected in the thickness direction,
wherein one of the first conductive layer and the second conductive layer is disposed in the opening when projected in the thickness direction, and
a periphery of the other of the first conductive layer and the second conductive layer is disposed outside of the opening when projected in the thickness direction.

2. The wired circuit board according to claim 1, wherein the first conductive layer is disposed in the opening when projected in the thickness direction, and
a periphery of the second conductive layer is disposed outside the opening when projected in the thickness direction.

3. The wired circuit board according to claim 1, wherein at least a portion of one side face of the first conductive layer in the thickness direction is in contact with the second conductive layer.

4. The wired circuit board according to claim 1, wherein the first conductive layer is disposed so as to be in spaced-apart relation from the second conductive layer in the thickness direction.

5. The wired circuit board according to claim 1, wherein a periphery of one of the first conductive layer and the second conductive layer is disposed entirely within the opening when projected in the thickness direction.

6. The wired circuit board according to claim 1, wherein a periphery of the first conductive layer is disposed entirely within the opening when projected in the thickness direction.

* * * * *